(12) United States Patent
Hwang

(10) Patent No.: US 8,223,054 B2
(45) Date of Patent: Jul. 17, 2012

(54) DIGITAL-ANALOG CONVERTER

(75) Inventor: Sang Hoon Hwang, Seoul (KR)

(73) Assignee: Samsung Electro-Mechanics Co., Ltd., Gyunggi-do (KR)

( * ) Notice: Subject to any disclaimer, the term of this patent is extended or adjusted under 35 U.S.C. 154(b) by 0 days.

(21) Appl. No.: 12/805,508

(22) Filed: Aug. 3, 2010

(65) Prior Publication Data

US 2011/0140943 A1 Jun. 16, 2011

(30) Foreign Application Priority Data

Dec. 15, 2009 (KR) .................. 10-2009-0125094

(51) Int. Cl.
*H03M 1/66* (2006.01)
(52) U.S. Cl. ......................... 341/144; 341/136
(58) Field of Classification Search .................. 341/144, 341/136, 135, 145; 345/76; 327/432, 433, 327/434, 379, 53, 403, 404, 405, 80
See application file for complete search history.

(56) References Cited

U.S. PATENT DOCUMENTS 3,995,304 A * 11/1976 Pease .......................... 257/579
7,129,871 B1 * 10/2006 Venes et al. .................. 341/136

FOREIGN PATENT DOCUMENTS

| JP | 2009015454 A | 1/2009 |
| KR | 1020040099887 A | 12/2004 |

OTHER PUBLICATIONS

J. Moon, et al., "Design of a Current Steering CMOS D/A Converter with an Adaptive Control Switch and a Novel Layout Technique," 2008 IEEe ICICDT, Jun. 2008.
KIPO Office Action for KR 10-2009-0125094, issued Apr. 27, 2011.

* cited by examiner

*Primary Examiner* — Joseph Lauture
(74) *Attorney, Agent, or Firm* — Lowe, Hauptman, Ham & Berner, LLP

(57) ABSTRACT

In order to reduce a current mismatch by laying-out the bias circuit of current cells adjacent to each other in a common current centroid manner or connecting the output lines of the current cells in a tournament manner, there is provided a digital-analog converter in which a plurality of current cells are two dimensionally and symmetrically disposed according to a previously determined order, the digital-analog converter including: a first current cell group including a portion of the plurality of current cells; and a second current cell group including the rest of the plurality of current cells, not included in the first current cell group, the outputs of each current cell of the first current cell group being connected to the outputs of each current cell of the second current cell group in a tournament manner, wherein each of the plurality of current cells includes: a switch circuit switching the output and block of a unit current according to an input signal; and a bias circuit mirroring current supplied according to the switching of the switch circuit and converting the current into the unit current, the bias circuit of two current cells adjacent to each other among the plurality of current cells being laid-out in a common current centroid manner.

9 Claims, 5 Drawing Sheets

DIGITAL-ANALOG CONVERTER

CROSS-REFERENCE TO RELATED APPLICATIONS

This application claims the priority of Korean Patent Application No. 10-2009-0125094 filed on Dec. 15, 2009, in the Korean Intellectual Property Office, the disclosure of which is incorporated herein by reference.

BACKGROUND OF THE INVENTION

1. Field of the Invention

The present invention relates to a digital-analog converter, and more particularly, to a digital-analog converter that reduces a current mismatch by laying-out the bias circuit of current cells adjacent to each other in a common current centroid manner or connecting the output lines of the current cells in a tournament manner.

2. Description of the Related Art

A digital-analog converter has been used for converting a digital signal into an analog signal corresponding thereto in various electronic circuits.

For example, a high-resolution and high-speed digital-analog converter has been applied in cellular base stations, wireless communications, direct digital frequency syntheses, signal reproductions, test equipment, high-resolution imaging systems, and optional waveform generators.

As the digital-analog converter, a digital-analog converter configured of a current cell matrix has been mainly used. In the digital-analog converter configured of the current cell matrix, the linearity of the output may be reduced due to a mismatch of a current source.

The mismatch of the current source may be generated due to a voltage drop generated along a power line, change in idle variation, thermal distribution in a chip, a current value mismatch according to current directions and the like. Therefore, a problem arises in that linearity is reduced due to a graded error, a symmetrical error, a random error and the like.

SUMMARY OF THE INVENTION

An aspect of the present invention provides a digital-analog converter that reduces a current mismatch by laying-out the bias circuit of current cells adjacent to each other in a common current centroid manner or connecting the output lines of the current cells in a tournament manner.

According to an aspect of the present invention, there is provided a digital-analog converter in which a plurality of current cells are two dimensionally and symmetrically disposed according to a previously determined order, each of the plurality of current cells including: a switch circuit switching the output and block of a unit current according to an input signal; and a bias circuit mirroring current supplied according to the switching of the switch circuit and converting the current into the unit current, wherein the bias circuit of two current cells adjacent to each other among the plurality of current cells is laid-out in a common current centroid manner.

The switch circuit may be a cascode switch circuit having a differential pair structure.

The bias circuit may include first and second NMOS transistors being cascode connected between the source of the cascode switch circuit having the differential pair structure and a ground.

According to another aspect of the present invention, there is provided a digital-analog converter in which a plurality of current cells are two dimensionally and symmetrically disposed according to a previously determined order, the digital-analog converter including: a first current cell group including a portion of the plurality of current cells; and a second current cell group including the rest of the plurality of current cells, not included in the first current cell group, wherein the outputs of each current cell of the first current cell group are connected to the outputs of each current cell of the second current cell group in a tournament manner.

The first and second current cell groups may include a portion or another portion of the plurality of current cells according to the previously determined order.

The first current cell group may include the current cells corresponding to most significant bits, among the plurality of current cells, according to the previously determined output order of signals, and the second current cell group may include the current cells corresponding to least significant bits, among the plurality of current cells, according to the previously determined output order of signals.

According to another aspect of the present invention, there is provided a digital-analog converter in which a plurality of current cells are two dimensionally and symmetrically disposed according to a previously determined order, the digital-analog converter including: a first current cell group including a portion of the plurality of current cells; and a second current cell group including the rest of the plurality of current cells, not included in the first current cell group, the outputs of each current cell of the first current cell group being connected to the outputs of each current cell of the second current cell group in a tournament manner, wherein each of the plurality of current cells includes: a switch circuit switching the output and block of a unit current according to an input signal; and a bias circuit mirroring current supplied according to the switching of the switch circuit and converting the current into the unit current, the bias circuit of two current cells adjacent to each other among the plurality of current cells being laid-out in a common current centroid manner.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1:
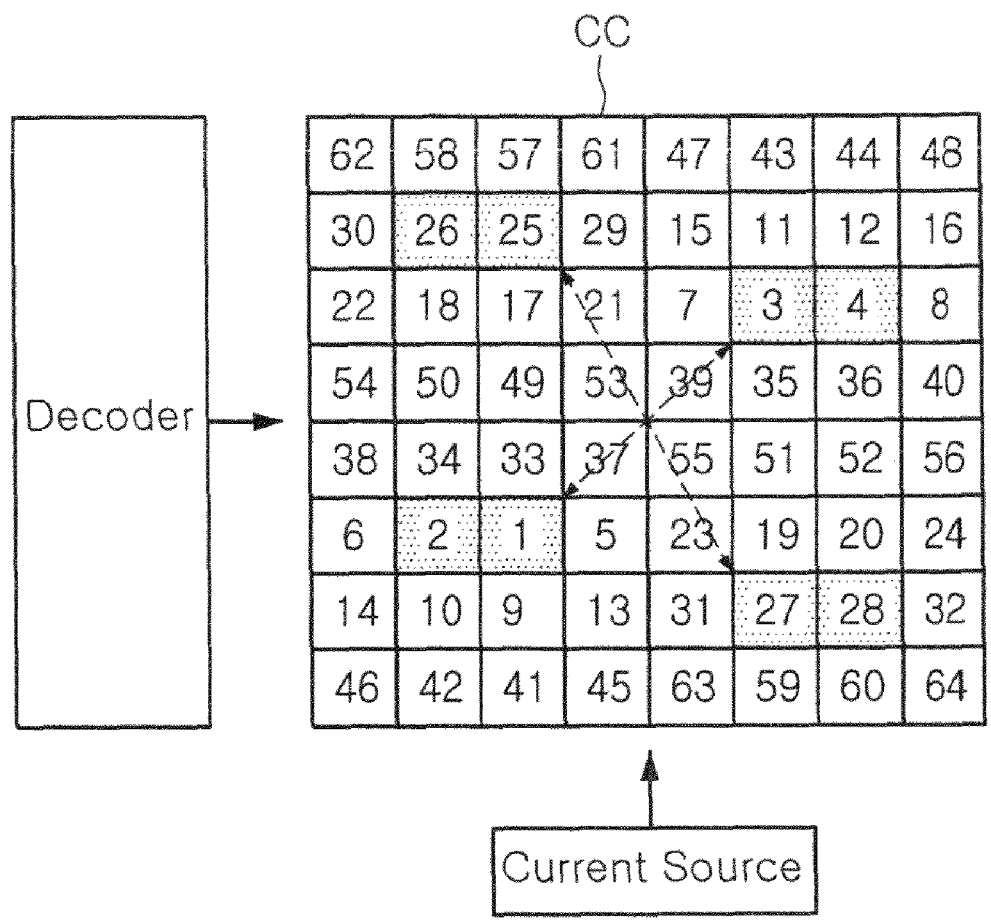
FIG. 1 is a schematic constitution diagram of a digital-analog converter in which current cells are two dimensionally and symmetrically disposed.

FIG. 1 is a schematic constitution diagram of a digital-analog converter in which current cells are two dimensionally and symmetrically disposed.

Referring to FIG. 1, in the digital-analog converter, a plurality of current cells CC are two dimensionally and symmetrically disposed according to order that signals are output, as marked by an arrow.

The plurality of current cells CC are provided with current from a current source and the supplied current is switched by a decoder, thereby making it possible to output signals corresponding thereto.

Figure 2:
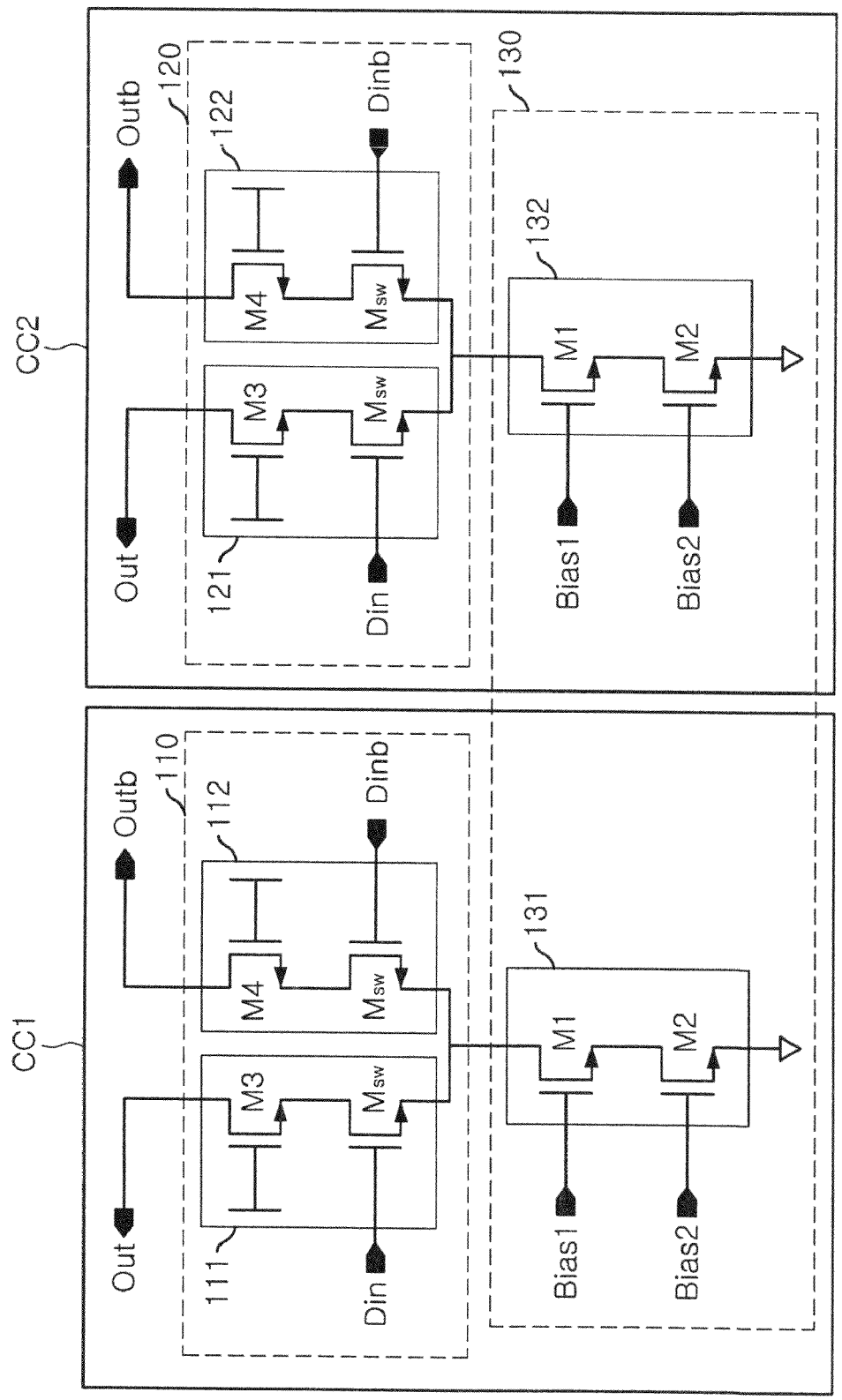
FIG. 2 is a schematic constitution diagram showing one example of current cells used in a digital-analog converter according to an exemplary embodiment of the present invention.

FIG. 2 is a schematic constitution diagram showing one example of current cells used in a digital-analog converter according to an exemplary embodiment of the present invention.

As shown in FIG. 1, the plurality of cells CC1 and CC2, two dimensionally and symmetrically disposed, each may include switch circuits 110 and 120 and a bias circuit 130, respectively, as shown in FIG. 2.

The switch circuits 110 and 120 may be configured of a pair of cascode switches 111, 112, 121, and 122 in which NMOS transistors thereof are connected in series.

Each of the pair of cascode switches 111, 112, 121, and 122 in the switch circuits 110 and 120 as described above may include one NMOS transistor Msw that receives signals Din and Dinb from the decoder and further NMOS transistors M3 and M4 that switch a unit current and output it into output signals Out and Outb.

The bias circuit 130 may be configured of cascode switches 131 and 132 in which the NMOS transistors M1 and M2 are connected in series, wherein each bias current Bias1 and Bias2 may be input into the NMOS transistors M1 and M2 thereof. The NMOS transistors M1 and M2 thereof may mirror the bias currents Bias1 and Bias2 and convert them into a unit current.

Figure 3:
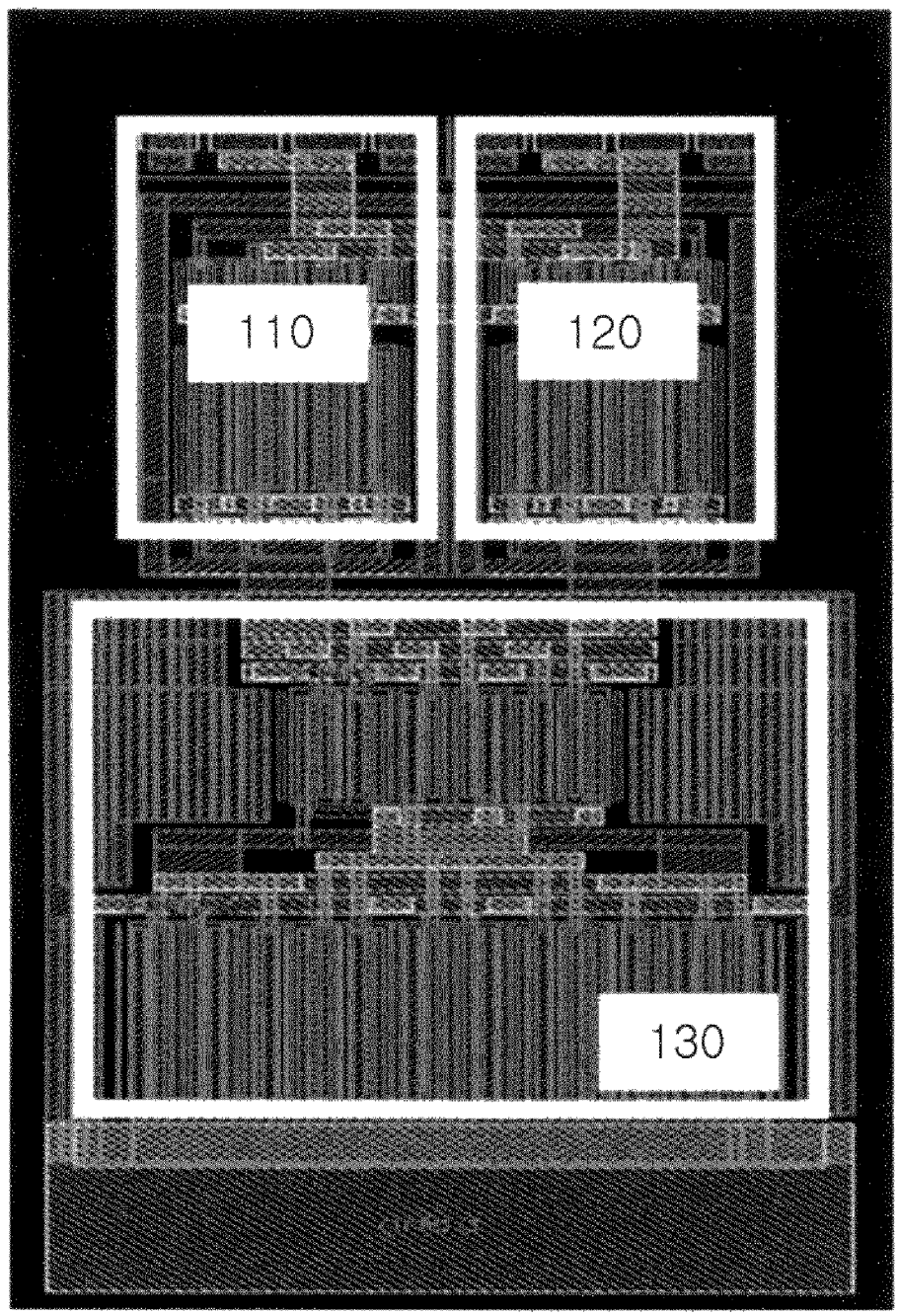
FIG. 3 is a layout of the current cells shown in FIG. 2.

FIG. 3 is a layout of the current cells shown in FIG. 2.

As shown in FIG. 3, the bias circuit 130 of two current cells CC1 and CC2 adjacent to each other among the plurality of current cells may be laid-out in a common current centroid manner.

In other words, the digital-analog converter may be constituted as a single integrated circuit. At this time, the plurality of current cells may be constituted as a single integrated circuit, wherein when the switch circuits 110 and 120 of the two current cells CC1 and CC2 adjacent to each other and the bias circuit 130 are laid-out, the bias circuit 130 is laid-out in a common current centroid manner. As the bias circuit 130 of the two current cells CC1 and CC2 is laid-out in a common current centroid manner, the number of cases of a current mismatch that may be generated from each current cell can be reduced by half.

In other words, when 16 current cells are provided, the current mismatch may be generated in each of the 16 current cells. However, the bias circuit of the two current cells adjacent to each other is laid-out in a common current centroid manner, such that the current mismatch can be reduced by a total of 8 cases.

Figure 4:
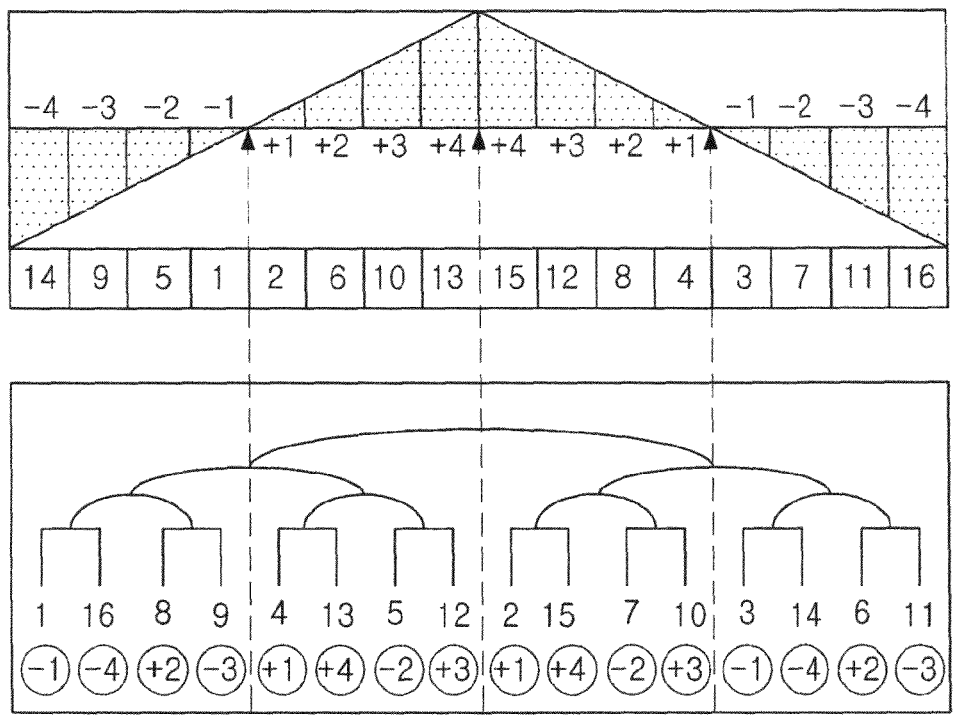
FIG. 4 is a schematic connection diagram showing a connection relationship of outputs of each current cell of a digital-analog converter according to an exemplary embodiment of the present invention.

FIG. 4 is a schematic connection diagram showing a connection relationship of outputs of each current cell of a digital-analog converter according to an exemplary embodiment of the present invention.

Referring to FIG. 4, the plurality of current cells of the digital-analog converter according to an exemplary embodiment of the present invention may be divided into a first current cell group and a second current cell group.

The first current cell group and the second current cell group each can include the current cells by dividing the plurality of current cells into two.

The first current cell group and the second current cell group each may include the current cells according to the previously determined order, wherein the previously determined order may be the output order of signals.

Therefore, the first current cell group may include the current cells corresponding to most significant bits, among the plurality of current cells, according to the previously determined output order of signals, and the second current cell group may include the current cells corresponding to least significant bits, among the plurality of current cells, according to the previously determined output order of signals.

The outputs of each current cell of the first current cell group and the second current cell group may be connected in a tournament manner.

In other words, when the digital-analog converter includes a total of 16 current cells as shown in FIG. 4, the current cells corresponding to the most significant bits, from a first current cell to an eighth current cell, may be included in the first current cell group, and the current cells corresponding to the least significant bits, from a ninth current cell to a sixteenth current cell, may be included in the second current cell group.

At this time, the outputs of each current cell of the first current cell group and the second current cell group may be connected in a tournament manner.

In other words, the output of the first current cell and the output of the sixteenth current cell may be connected to each other, and the output of the second current cell and the output of the fifteenth current cell may be connected to each other.

Herein, the output of the first current cell has a deviation of −1 as compared to a reference current and the output of the sixteenth current cell has a deviation of −4 as compared to the reference current. As shown in FIG. 4, the outputs of each current cell may have each deviation as compared to the reference current. Therefore, if the outputs of each current cell of the first current cell group and the second current cell group are connected to each other in a tournament manner, the outputs of the current cells may finally have a deviation of 0 as compared to the reference current.

Figure 5:
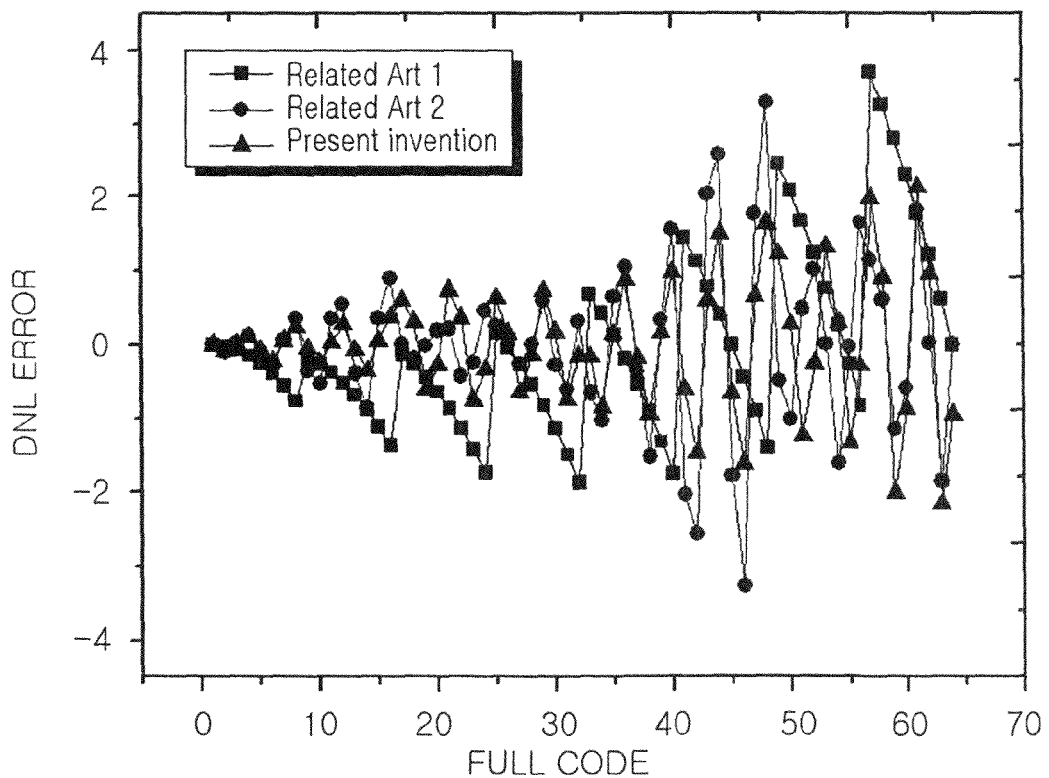
FIGS. 5 and 6 are graphs showing the electrical characteristics of a digital-analog converter according to an exemplary embodiment of the present invention.
Figure 6:
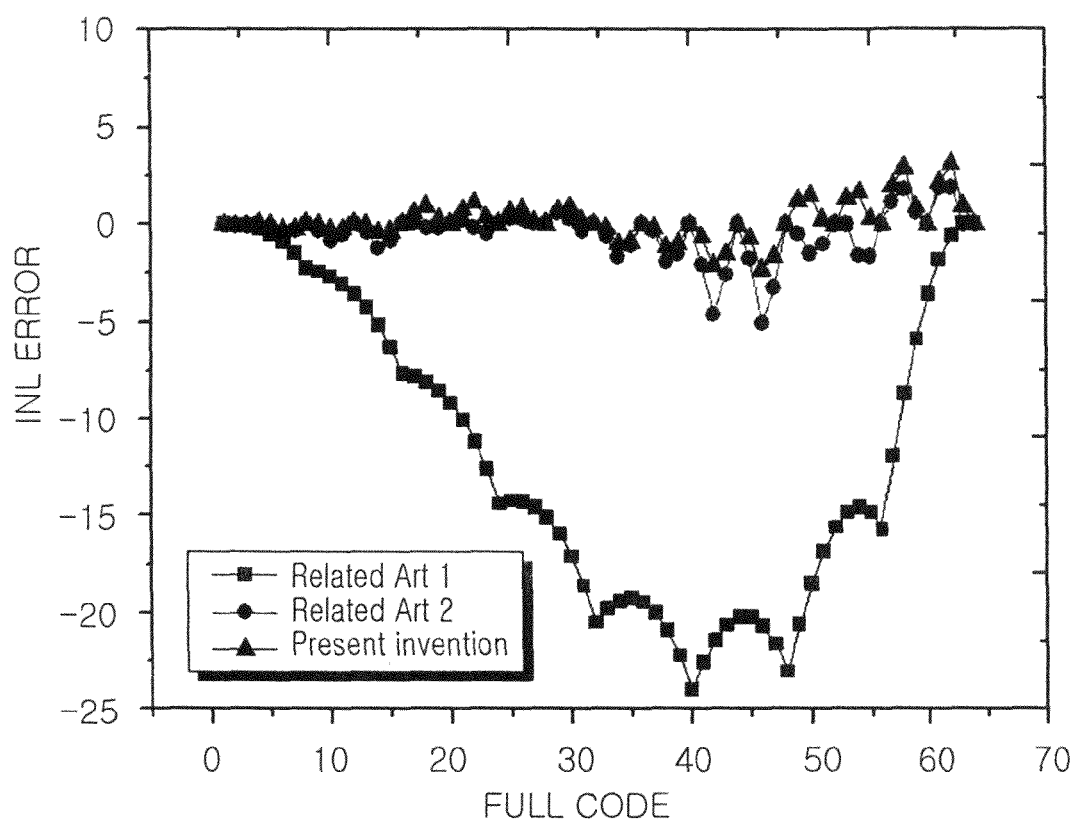

FIGS. 5 and 6 are graphs showing the electrical characteristics of a digital-analog converter according to an exemplary embodiment of the present invention.

As described above, the digital-analog converter according to the exemplary embodiment of the present invention reduces a current mismatch, thereby making it possible to have the electrical characteristics as compared to the prior art.

Herein, prior art 1 means a general digital-analog converter according to the prior art and prior art 2 means a digital-analog converter where current cells are two dimensionally and symmetrically disposed.

As shown in FIG. 5, it can be appreciated that the digital-analog converter according to the present invention reduces a Differential Non-Linearity (DNL) error as compared to prior art 1 and prior art 2. As shown in FIG. 6, it can be appreciated that the digital-analog converter according to the present invention reduces an Integral Non-Linearity (INL) error as compared to prior art 1 and prior art 2.

As set forth above, according to exemplary embodiments of the present invention, the bias circuit of the current cells adjacent to each other is laid-out in a common current centroid manner or the output lines of the current cells are connected in a tournament manner, making it possible to reduce the current mismatch.

While the present invention has been shown and described in connection with the exemplary embodiments, it will be apparent to those skilled in the art that modifications and variations can be made without departing from the spirit and scope of the invention as defined by the appended claims.

What is claimed is:

1. A digital-analog converter, comprising a plurality of current cells disposed two dimensionally and symmetrically according to a previously determined order, each of the current cells comprising:
   a switch circuit for performing a switching between outputting and blocking a unit current according to an input signal; and
   a bias circuit for minoring a current supplied according to the switching of the switch circuit and converting the current into the unit current, wherein
   the bias circuit for two adjacent current cells among the current cells is laid-out in a common current centroid manner,
   the switch circuit is a cascode switch circuit having a differential pair structure, and
   the bias circuit includes first and second n-channel metal-oxide semiconductor (NMOS) transistors being cascode connected between a source of the cascode switch circuit and a ground.

2. A digital-analog converter, comprising a plurality of current cells disposed two dimensionally and symmetrically according to a previously determined order, the digital-analog converter comprising:
   a first current cell group including a portion of the current cells; and
   a second current cell group including the rest of the current cells, not included in the first current cell group, wherein
   outputs of the current cells of the first current cell group are connected to outputs of the current cells of the second current cell group in a tournament manner.

3. The digital-analog converter of claim 2, wherein the first and second current cell groups include a portion or another portion of the current cells according to the previously determined order.

4. The digital-analog converter of claim 3, wherein
   the first current cell group includes current cells corresponding to most significant bits, among the current cells, according to a previously determined output order of signals, and
   the second current cell group includes current cells corresponding to least significant bits, among the current cells, according to the previously determined output order of signals.

5. A digital-analog converter, comprising a plurality of current cells disposed two dimensionally and symmetrically according to a previously determined order, the digital-analog converter comprising:
   a first current cell group including a portion of the current cells; and
   a second current cell group including the rest of the current cells, not included in the first current cell group, wherein
   outputs of the current cells of the first current cell group are connected to outputs of the current cells of the second current cell group in a tournament manner,
   each of the current cells includes:
      a switch circuit for performing a switching between outputting and blocking a unit current according to an input signal; and
      a bias circuit for minoring a current supplied according to the switching of the switch circuit and converting the current into the unit current, and
   the bias circuit for two adjacent current cells among the current cells is laid-out in a common current centroid manner.

6. The digital-analog converter of claim 5, wherein the first and second current cell groups include a portion or another portion of the current cells according to the previously determined order.

7. The digital-analog converter of claim 6, wherein
   the first current cell group includes current cells corresponding to most significant bits, among the current cells, according to a previously determined output order of signals, and
   the second current cell group includes current cells corresponding to least significant bits, among the current cells, according to the previously determined output order of signals.

8. The digital-analog converter of claim 5, wherein the switch circuit is a cascode switch circuit having a differential pair structure.

9. The digital-analog converter of claim 8, wherein the bias circuit includes first and second n-channel metal-oxide semiconductor (NMOS) transistors being cascode connected between a source of the cascode switch circuit and a ground.

* * * * *